(12) United States Patent
Aono

(10) Patent No.: US 8,525,040 B2
(45) Date of Patent: Sep. 3, 2013

(54) CIRCUIT BOARD AND ITS WIRE BONDING STRUCTURE

(75) Inventor: Shigeo Aono, Soraku-gun (JP)

(73) Assignee: Kyocera Corporation, Kyoto (JP)

( * ) Notice: Subject to any disclaimer, the term of this patent is extended or adjusted under 35 U.S.C. 154(b) by 264 days.

(21) Appl. No.: 13/061,097

(22) PCT Filed: Aug. 31, 2009

(86) PCT No.: PCT/JP2009/065225
§ 371 (c)(1),
(2), (4) Date: Feb. 25, 2011

(87) PCT Pub. No.: WO2010/024442
PCT Pub. Date: Mar. 4, 2010

(65) Prior Publication Data
US 2011/0155423 A1    Jun. 30, 2011

(30) Foreign Application Priority Data

Aug. 29, 2008 (JP) .................................. 2008-222506
Mar. 26, 2009 (JP) .................................. 2009-076241

(51) Int. Cl.
*H05K 1/09* (2006.01)

(52) U.S. Cl.
USPC ............ 174/257; 174/250; 174/255; 174/261

(58) Field of Classification Search
USPC .................. 174/250, 255, 257, 259, 260, 261
See application file for complete search history.

(56) References Cited

U.S. PATENT DOCUMENTS

| | | | | |
|---|---|---|---|---|
| 6,495,773 | B1 * | 12/2002 | Nomoto et al. | 174/260 |
| 2004/0056337 | A1 * | 3/2004 | Hasebe et al. | 257/667 |
| 2005/0269579 | A1 * | 12/2005 | Yukimoto et al. | 257/81 |
| 2009/0294158 | A1 * | 12/2009 | Matsushima et al. | 174/257 |
| 2009/0314534 | A1 * | 12/2009 | Matsuoka et al. | 174/260 |

FOREIGN PATENT DOCUMENTS

| | | |
|---|---|---|
| JP | 09-289276 | 11/1997 |
| JP | 2002-171020 | 6/2002 |
| JP | 2002171020 A | 6/2002 |
| JP | 2005-150294 | 6/2005 |
| JP | 2005-236234 | 9/2005 |
| JP | 2008-112883 | 5/2008 |
| JP | 2008112883 A | 5/2008 |

OTHER PUBLICATIONS

International preliminary report on patentability dated Apr. 21, 2011 for corresponding PCT application PCT/JP2009/065225.

* cited by examiner

*Primary Examiner* — Hoa C Nguyen
(74) *Attorney, Agent, or Firm* — DLA Piper LLP (US)

(57) ABSTRACT

The invention relates to a circuit board, and an image forming apparatus, a thermal head and an image sensor that employ the circuit board. A circuit board includes a substrate, a conductor which is situated on the substrate and has a groove formed on its surface, and a wire connected to the conductor. The groove surrounds a connection area between the wire and the conductor, excluding a part of the connection area defining an opening (X).

3 Claims, 12 Drawing Sheets

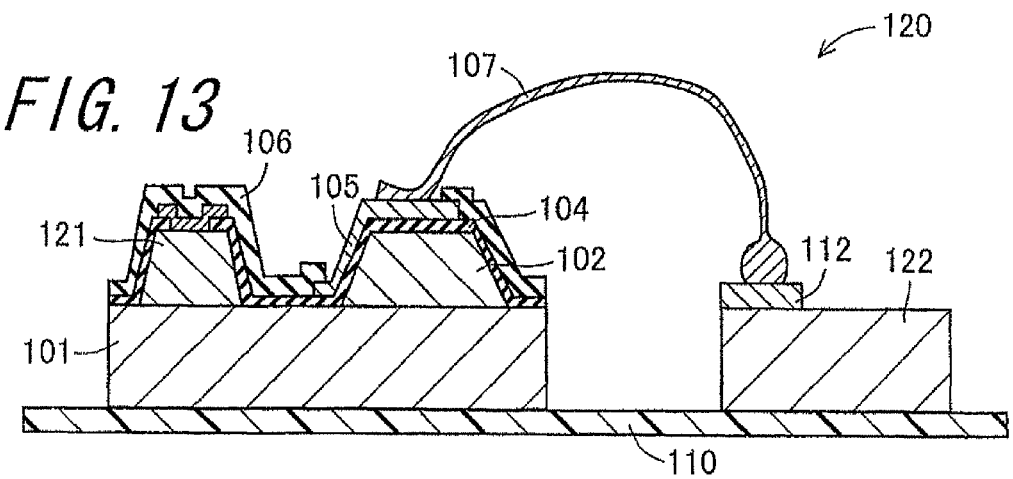
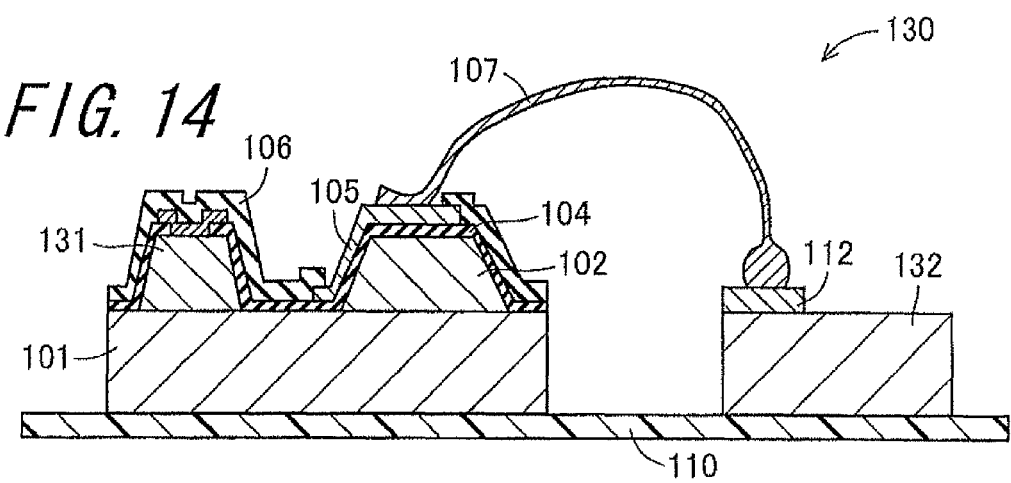

US 8,525,040 B2

CIRCUIT BOARD AND ITS WIRE BONDING STRUCTURE

CROSS-REFERENCE TO THE RELATED APPLICATIONS

This application is a national stage of international application No. PCT/JP2009/065225, filed on Aug. 31, 2009, and claims the benefit of priority under 35 USC 119 to Japanese Patent Application No. 2008-222506, filed on Aug. 29, 2008 and Japanese Patent Application No. 2009-076241, filed on Mar. 26, 2009, the entire contents of all of which are incorporated herein by reference.

TECHNICAL FIELD

The present invention relates to a circuit board, and to an image forming apparatus, a thermal head, and an image sensor that employ the circuit board.

BACKGROUND ART

In recent years, a circuit board, and various apparatuses employing the circuit board such as an image forming apparatus, a thermal head, and an image sensor have come to be increasingly smaller.

In order to achieve miniaturization of such apparatuses, a device to be formed on a substrate constituting the circuit board has to be downsized in itself by necessity, in consequence whereof there results a trend toward smaller and smaller conductors. Correspondingly, a diameter of a wire and a size of a bonding tool (such as a capillary) need to be reduced, which has created a demand for enhancement of the strength of adhesion between a conductor and a wire.

SUMMARY OF INVENTION

Accordingly, an object of the invention is to provide a circuit board capable of providing highly reliable electrical connection even with apparatus miniaturization, and an image forming apparatus, a thermal head, and an image sensor that employ the circuit board.

A circuit board in accordance with one embodiment of the invention comprises a substrate, a conductor, and a wire. The conductor is situated on the substrate, and has a groove formed on its surface. The wire is connected to the conductor. The groove surrounds a connection area between the wire and the conductor, excluding a part of the connection area defining an opening.

An image forming apparatus in accordance with another embodiment of the invention comprises the circuit board and a first driving circuit.

A thermal head in accordance with still another embodiment of the invention comprises the circuit board and a second driving circuit.

An image sensor in accordance with a yet further embodiment of the invention comprises the circuit board and an arithmetic circuit.

According to the constructions of the embodiments, the wire can be made resistant to separation. This makes it possible to enhance the reliability of connection and thereby prolong the service life of the apparatus.

BRIEF DESCRIPTION OF DRAWINGS

Other and further objects, features, and advantages of the invention will be more explicit from the following detailed description taken with reference to the drawings wherein:

FIG. 13 is a sectional view showing a thermal head in accordance with an embodiment of the invention; and FIG. 14 is a sectional view showing an image sensor in accordance with an embodiment of the invention.

DESCRIPTION OF EMBODIMENTS

Hereinafter, preferred embodiments of the invention will be described in detail with reference to the drawings. It should be understood that the constructions illustrated in the following drawings are cited merely by way of embodiments of the invention and without limitation.

As to Basic Configuration of Circuit Board

Figure 3:
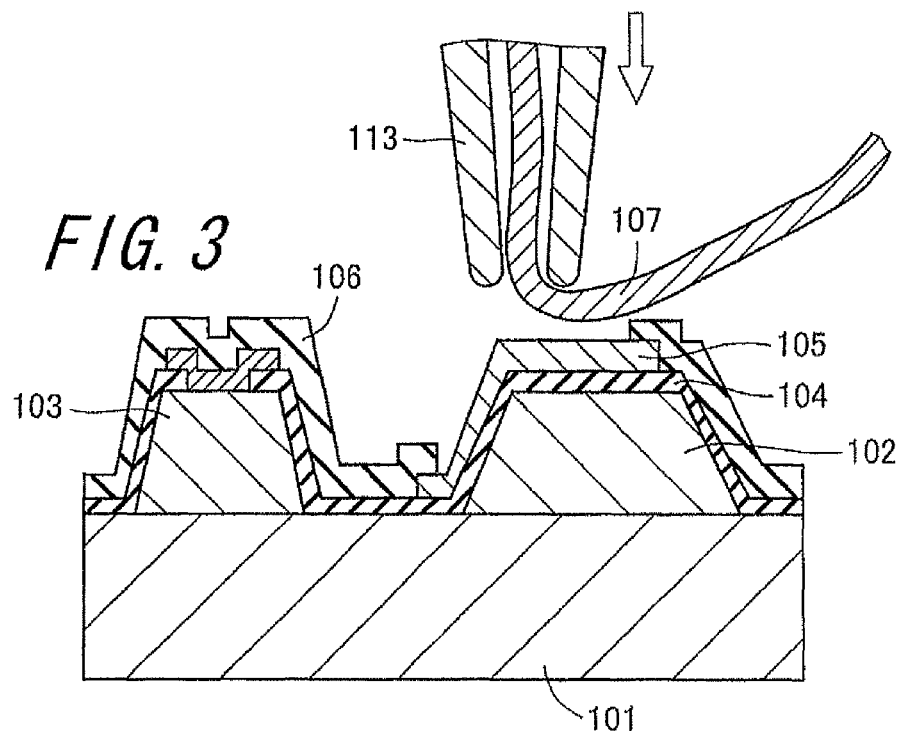
FIG. 3 is a sectional view showing a process step of bonding the wire to the conductor by stitch bonding.
Figure 4A:
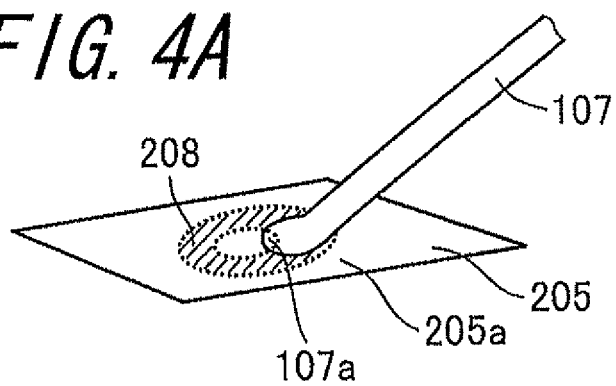
FIG. 4A is a perspective views of the structure of connection between the conductor and the wire.
Figure 4B:
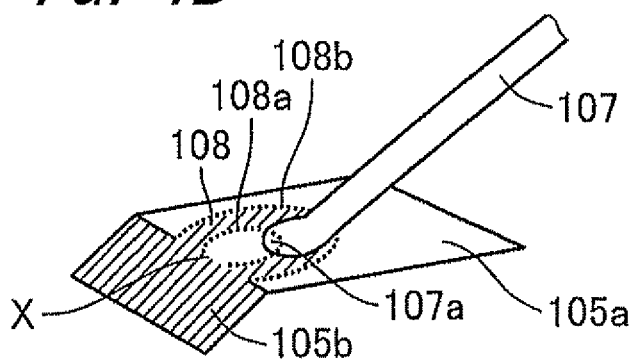
FIG. 4B is a perspective views of the structure of connection between the conductor and the wire.
Figure 4C:
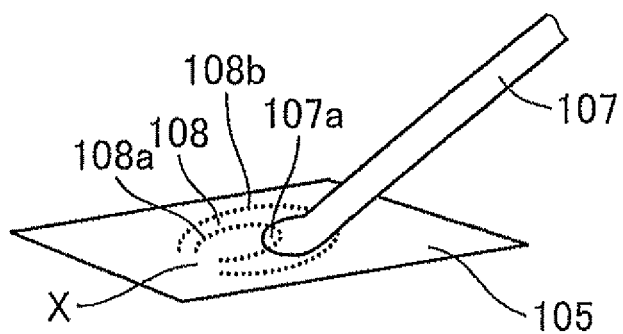
FIG. 4C is a perspective views of the structure of connection between the conductor and the wire.

As shown in FIG. 4C, a circuit board in accordance with one embodiment of the invention comprises a conductor 105 situated on a substrate and a wire 107 which establishes connection (bonding) to the conductor 105. The conductor 105 has a groove 108 formed on its surface. For example, as shown in FIG. 3, the groove 108 can be formed by pressing a capillary against the conductor 105 at the time of bonding the wire 107 to the conductor 105. The groove 108 is so formed as to surround a connection area 107a between the wire 107 and the conductor 105 (hatched area in the figure) excluding a part of the connection area defining an opening X. As employed herein, the wording "area surrounded by the groove" refers to an area surrounded by an outer edge 108b of the groove 108 and the opening X as shown in FIG. 4C. A region inside the groove 108 and a region outside the groove 108 are continuous with each other at the opening X. It is noted that the region inside the groove, namely an inner region refers to the area surrounded by the groove 108 as described above.

Moreover, in FIG. 4B, there is shown another structure of connection between the conductor 105 and the wire 107 than the connection structure as shown in FIG. 4A. In FIG. 4B, the conductor 105 is placed on a base portion having a top surface and a lateral surface. In this embodiment, the conductor 105 comprises a pad part 105a situated on the top surface of the base portion and a lateral wiring part 105b which lies on the lateral surface of the base portion so as to be electrically connected to the pad part 105a. The opening X is situated at the boundary of the pad part 105a and the lateral wiring part 105b.

According to the construction of the present embodiment, satisfactory adherability can be attained on the following grounds. Now, the working effects of the present embodiment will be explained with reference to FIGS. 4A to 4C. FIGS. 4A to 4C are schematic perspective views of the structure of connection between the conductor and the wire, with FIG. 4A showing a structure which is not embraced by the embodiment of the invention, and FIGS. 4B and 4C each showing a structure which is embraced by the embodiment of the invention. It is noted that, in the drawings showing the groove 108, for a better understanding of the connection area 107a, the groove 108 is illustrated as having a width greater than its actual width; that is, the drawings are not based on the actual dimensions.

In the structure as shown in FIG. 4A, a conductor 205 and a wire 107 constitute the connection area 107a, and a groove 208 created at the time of wire bonding such as a stitch bonding is left on a pad part 205a. The connection area 107a is present in a region surrounded by the groove 208. However, where the circuit board is downsized, the region surrounded by the groove 208 could be separated from the conductor 205 for reasons as will hereafter be described. If separation occurs, the connection area 107a will be brought into a barely connectable state only with the adhesion force of the narrow region surrounded by the groove 208, which gives rise to the risk of separation of the connection area 107a from the substrate.

By contrast, in the structure of the embodiment as shown in FIG. 4B, a pad part 105a and a wire 107 constitute the connection area 107a, and also, the groove 108 created at the time of wire bonding is present on the pad part 105a. In this respect this structure is similar to that as shown in FIG. 4A. However, in the structure of the embodiment as shown in FIG. 4B, the pad part 105a and the lateral wiring part 105b disposed on the base portion are connected to each other, and a part of the groove 108 is missing at the boundary with the lateral wiring part 105b at the side of the pad part 105a (the groove 108 is broken to form the opening X). According to this structure, the region of the pad part 105a bearing the connection area 107a is connected not only to the region surrounded by the groove 108 but also to the lateral wiring part 105b connected to the surrounded region. Therefore, even though the groove 108 becomes separated on the pad part 105a, it is not in a completely isolated state but is still connected to the lateral wiring part 105b. Accordingly this structure succeeds in providing better adherability than does the structure as shown in FIG. 4A.

Moreover, also in the structure as shown in FIG. 4C having a planar conductor 105, just as is the case with the structure as shown in FIG. 4B, satisfactory adhesion can be secured between the wire 107 and the conductor 105. That is, in the structure of FIG. 4C, a groove 108 is formed on a surface of the conductor 105, and the groove 108 is missing in part (the groove 108 is broken off to form an opening X). According to this structure, the inner region bearing the connection area 107a surrounded by the groove 108 is connected, through the opening X, to a region outside the groove 108.

Hereinafter, the inventor's knowledge of the influence of circuit board miniaturization upon the groove 108 will be explained.

The strength of connection between the wire 107 and the conductor 105 bonded to each other by means of stitch bonding or otherwise usually depends on: (i) the strength of the boundary between the wire 107 and the conductor 105 which is an object to be bonded; and (ii) the strength of tight contact between the conductor 105 and the substrate. Where the area of the conductor 105 is reduced to achieve miniaturization of the circuit board, there arises a need to reduce the diameter of the wire 107 or reduce the diameter of the front end of the capillary used for the connection between the wire 107 and the conductor 105 in response to the size reduction, which results in a tendency of the strength (i) to decrease.

In order to suppress a decrease in the strength (i), as a general measure, the wire 107 is crushed against the top of the conductor 105 to enhance the metal-to-metal bonding between the wire 107 and the conductor 105. In this case, however, since the capillary, whose diameter has been reduced in response to a reduction in the size of the conductor 105 of the circuit board, receives application of a greater force at its front end, it follows that the stress applied to the front end is increased, with the consequence that the thickness of that part of the conductor 105 which bears the groove 10 tends to be reduced. If the thickness of the conductor 105 is reduced in that way, separation could occur easily between the inner region surrounded by the groove 108 and the region around it. After all, the conductor 105 in the inner region, namely the region inside the groove 108, is brought into intimate contact with the substrate only at its small area, which results in an increase in the possibility of separation of the region inside the groove 108 from the substrate.

According to the structures as shown in FIGS. 4B and 4C, as has already been described, the region on the conductor 105 inside the groove 108 is connected, through the opening X, to the region outside the groove 108, namely the outer region. This makes it possible to strengthen the conductor 105 in the region inside the groove 108 where the connection area 107a is formed, and thereby attain satisfactory adherability.

The formation of the groove 108 on the conductor 105 in such a manner that the inner region and the outer region can be connected to each other through the opening X, as shown in FIG. 4C, can be achieved by tilting the substrate or capillary at the time of bonding the wire 107 to the conductor 105, for example. It is also advisable to change the shape of part of the front end of the capillary so as to avoid the front end part from making contact with the conductor 105.

Preferably, as shown in FIG. 4B, a base portion having a top surface and a lateral surface is disposed on the surface of the substrate, and a pad part 105a is formed on the top surface of the base portion and a lateral wiring part 105b is formed on the lateral surface of the base portion. That is, the conductor 105 may advisably be made in the form of a flat plate with a bend composed of the pad part 105a and the lateral wiring part 105b. In this case, simply by establishing connection while causing part of the front end of the capillary to lie off the edge of the pad part 105a, the groove 108 can be formed so that part of its area defines an opening X with ease without the necessity of tilting the substrate or capillary.

Moreover, where the conductor 105 is formed on the base portion as shown in FIG. 4B, the strength of adhesion of the wire 107 to the conductor 105 can be increased even further. That is, heretofore it has been customary to select by necessity a capillary having a front-end diameter which is small enough for the groove to stay in the pad part with stability. However, the structure as shown in FIG. 4B can be fabricated by using a capillary whose front-end diameter is larger than has been conventional. This makes it possible to increase the size of the boundary of the wire 107 and its area crushed by the capillary, and thereby enhance adherability even further.

As described hereinabove, according to FIGS. 4B and 4C showing the structure of connection between the conductor and the wire in the circuit board of one embodiment of the invention, the wire 107 is resistant to separation from the conductor 105. This makes it possible to enhance the reliability of connection and thereby prolong the service life of the apparatus.

As to Circuit Board having Driving Section

Circuit Board of First Embodiment

Next, a circuit board in accordance with a first embodiment of the invention will be explained by way of an embodiment equipped with a driving section such as a light-emitting element.

Figure 1A:
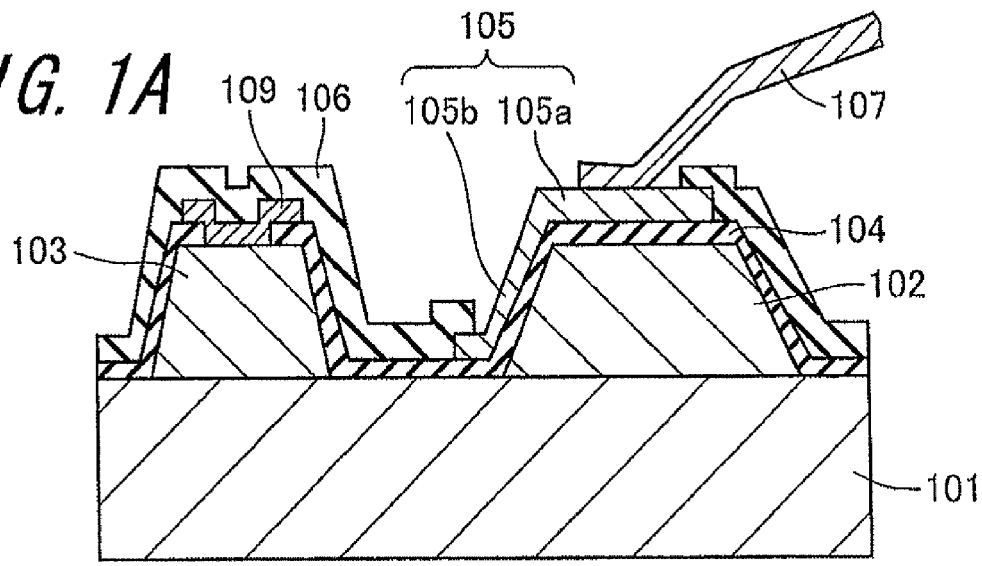
FIG. 1A is a sectional view showing a circuit board (light-emitting apparatus) in accordance with a first embodiment of the invention.

In a light-emitting apparatus as shown in FIG. 1A, on a substrate 101 are disposed a light-emitting element 103 serving as a driving section and a base portion 102. The substrate 101 is often constructed of a semiconductor of the same type as that used for the light-emitting element 103.

Specific examples of the light-emitting element 103 include semiconductor light-emitting elements such as a light-emitting diode or a light-emitting thyristor. The light-emitting element 103 is provided with an electrode 109 for application of light emission signals. The light-emitting element is formed by stacking n-type semiconductor layers and p-type semiconductor layers together. The detailed structure thereof will be described later.

The base portion 102 is formed on a surface of the substrate 101 so as to be placed at a different position from where the light-emitting element 103 is placed. The base portion has the shape of a truncated pyramid with a top surface and a lateral surface, and a conductor 105 is so formed as to extend over the top surface and the lateral surface continuously. A part of the conductor 105 which is situated on the top surface of the base portion 102 will be termed "pad part 105a", whereas a part of the conductor 105 which is situated on the lateral surface of the base portion 102 will be termed "lateral wiring part 105b". The pad part 105a is connected with a wire 107 made of Au or the like. The other end of the wire 107 (one of the ends of the wire 107 that is not connected to the pad 105a) is connected to an external driving circuit. The driving circuit drives the light-emitting element 103 to emit light.

It is preferable that the base portion 102 is, just like the light-emitting element 103, formed of semiconductor layers in terms of easiness of formation. In this case, however, the base portion 102 becomes electrically conductive and is thus brought into conductive relation with the conductor 105. Therefore a first insulating layer 104 is disposed on the base portion 102, and the conductor 105 is formed thereon. It is noted that, although the details of construction are not illustrated in the figure, the conductor 105 is electrically connected to the electrode 109 for applying a signal for light emission to the light-emitting element 103. When a light emission signal is applied to the wire 107 from the external driving circuit, the conductor 105 acts to pass the signal application to the light-emitting element 103.

A second insulating layer 106 is so formed as to cover at least the outer periphery of the conductor 105 and the electrode 109 of the light-emitting element 103. With the provision of the second insulating layer 106, it is possible to prevent intrusion of moisture from the boundary face at the outer periphery of the electrode and ensuing possible separation, and thereby achieve enhancement in reliability.

The first insulating layer 104 and the second insulating layer 106 are each formed of a film of a dielectric such as SiN and $SiO_2$, or made of a resin material such as polyimide.

Figure 1B:
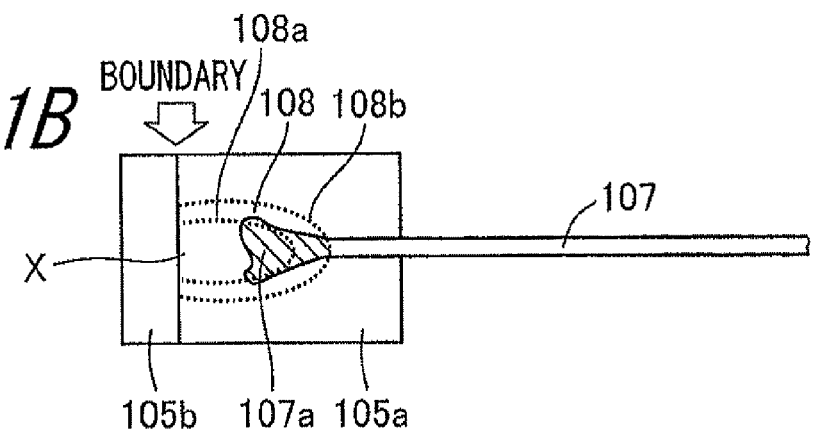
FIG. 1B is a plan view showing the circuit board (light-emitting apparatus) depicted in FIG. 1A.
Figure 1C:
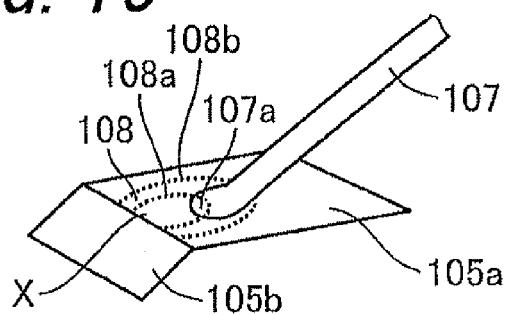
FIG. 1C is a perspective view showing the circuit board (light-emitting apparatus) depicted in FIG. 1A.

As shown in FIGS. 1B and 1C, the pad part 105a and the wire 107 constitute a connection area 107a. A groove 108, which appears at the time of connection, is missing in part at the boundary with the lateral wiring part 105b at the side of the pad part 105a so as to form an opening X. According to this structure, the region of the pad part 105a bearing the connection area 107a is connected not only to the region surrounded by the groove 108 but also to the lateral wiring part 105b which is continuous with the surrounded region.

It is noted that, in the truncated-pyramidal base portion 102 in a plan view, a side constituting the pad part 105a corresponds to the boundary with the lateral wiring part 105b. While the lateral wiring part 105b may be formed in coincidence with any one of the sides constituting the pad part 105a, preferably it should be formed in coincidence with a side nearest to the light-emitting element 103. In this way, the groove 108 can be configured to make contact with the boundary at the side of the light-emitting element 103 on the surface of the pad part 105a. Expressed differently, the groove 108 can be displaced toward the light-emitting element 103. As a result, the relevant base portions 102 (pad parts 105a) can be arranged at a closer spacing, wherefore the number of the base portions (pad parts) can be increased. This makes it possible to reduce the dimension of the light-emitting apparatus in a main scanning direction, as well as to produce a high-resolution light-emitting apparatus.

Figure 2:
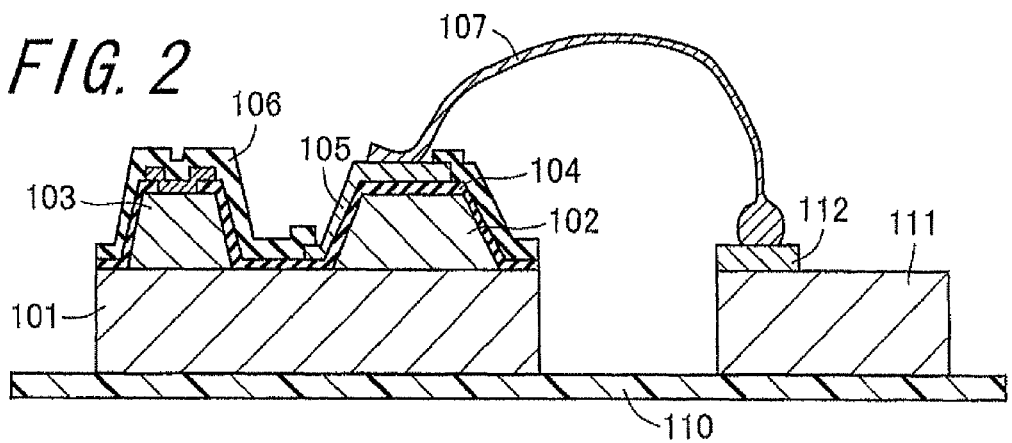
FIG. 2 is a sectional view showing an assembly body constructed by mounting the light-emitting apparatus shown in FIGS. 1A to 1C on a printed circuit board.

FIG. 2 is a schematic sectional view showing an assembly body constructed by mounting the light-emitting apparatus shown in FIGS. 1A to 1C on a printed circuit board 110. FIG. 3 is a sectional view showing a process step of bonding the wire 107 to the conductor 105 (pad part 105a) by stitch bonding.

As shown in FIG. 2, on the printed circuit board 110 are arranged the light-emitting apparatus of the first embodiment of the invention that has been described with reference to FIGS. 1A and 1B and a driving circuit such as an IC 111. An electrode 112 and the wire 107 are connected to each other. Although the description deals with the case where the driving circuit is connected to the electrode 112, the wire 107 may be disposed directly on a wiring pad made of copper or the like that is placed on the printed circuit board. Moreover, the driving circuit may be constructed on the circuit board of one embodiment of the invention.

The wire 107 is bonded to the electrode 112 of the IC 111 of the printed circuit board 110 in an initial step (first bonding), and is whereafter bonded to the conductor 105 (pad part 105a) at the side of the light-emitting element in a next step (second bonding). Specifically, the bonding operation is accomplished through the following process steps.

(1) Under a condition where the wire 107 has a ball-shaped part at its front end, a wire clamp is opened with consequent lowering of a capillary 113, so that the ball-shaped part can be brought into contact with its target object, namely the electrode 112, and also heat, a load, and ultrasound are transmitted to the ball, thereby establishing connection.

(2) The capillary 113 is raised to a certain height (loop height) and is whereafter moved to the conductor 105. At this time, in order to form a loop of stable shape, it is advisable to apply some stress to the wire 107 by causing the capillary 113 to move through a special path.

(3) The capillary 113 is lowered once again to press the wire 107 against the top of the pad part 105a. At this time, the wire 107 undergoes deformation under application of heat, a load, and ultrasound. In this way, a stitch bond for bonding the wire 107 onto a target object and a tail bond for securing a tail in a next step can be formed. It is noted that the term "tail" refers to a front end of the capillary 113 opposite from the end bearing the ball-shaped part.

In FIG. 3, there is shown a state where the capillary 113 is being lowered in this process step. In the present embodiment, in this process step, the capillary 113 is pressed against the pad part 105a while being displaced toward the lateral wiring part 105b. In this way, a capillary trace obtained by pressing the front end of the capillary 113 against the top of the pad part 105a is missing in part at the boundary with the lateral wiring part 105b.

(4) Next, the capillary 113 is raised with the wire 107 left in place. After a tail of certain length is secured at the front end of the capillary 113, the wire clamp is closed to hold the wire 107, and the wire 107 is torn away at the location of the tail bond. At this time, being temporarily retained by the tail bond, the wire 107 will not be raised in conjunction with the capillary 113.

(5) At the front end of the capillary 113, the tail is subjected to a high voltage to make a spark. The juncture in the tail is melted by the spark-induced heat, and the molten juncture is then solidified in the form of a substantially spherical ball under the action of surface tension. From then on, the procedure returns to the step (1) to continue the bonding operation.

As to Details of Constituent Components of Circuit Board

Hereinafter, the components that make up the circuit board of the embodiment of the invention will be explained in more detail.

Circuit Board of Second Embodiment

Figure 5:
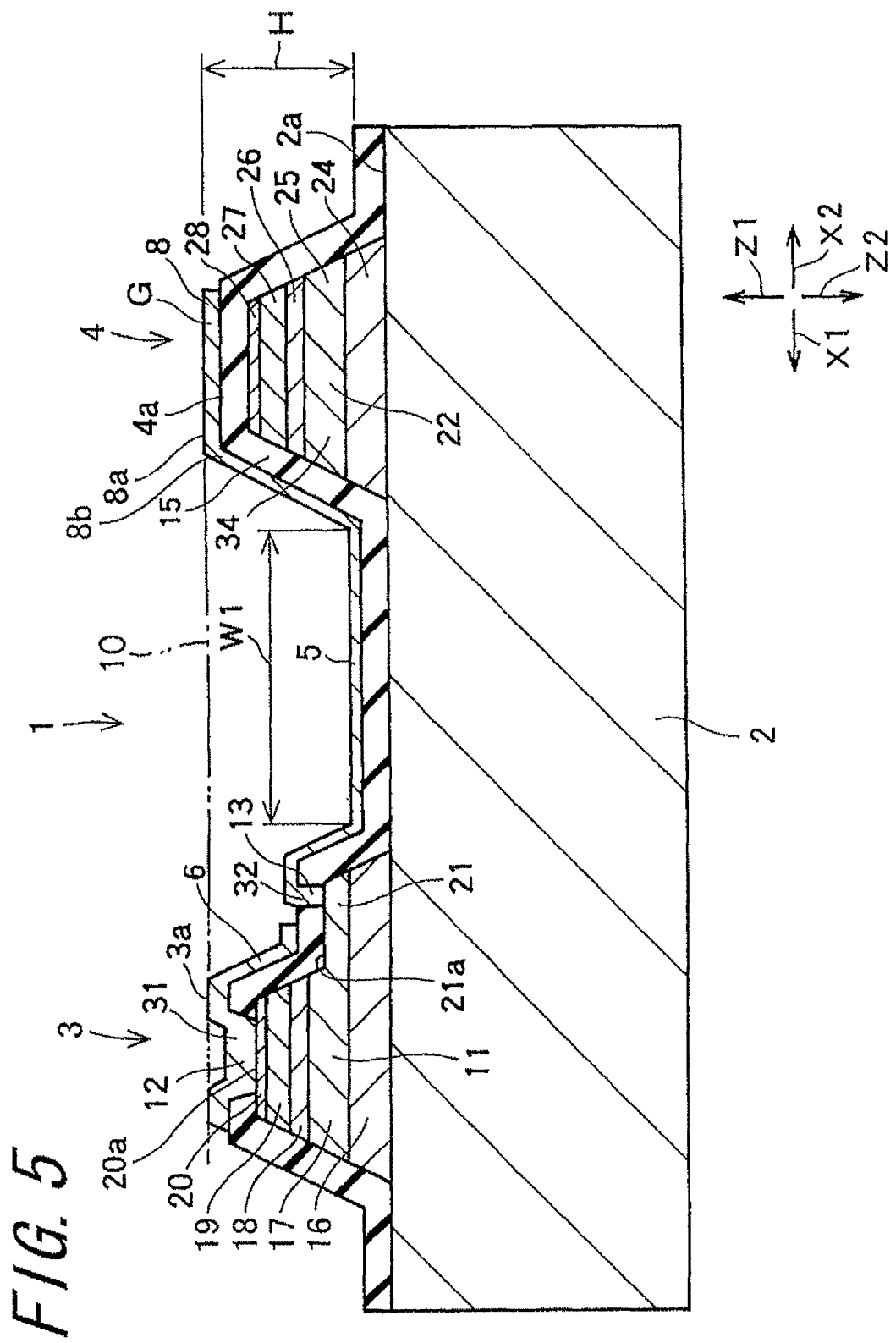
FIG. 5 is a sectional view showing the circuit board (light-emitting apparatus) in accordance with a second embodiment of the invention.
Figure 6:
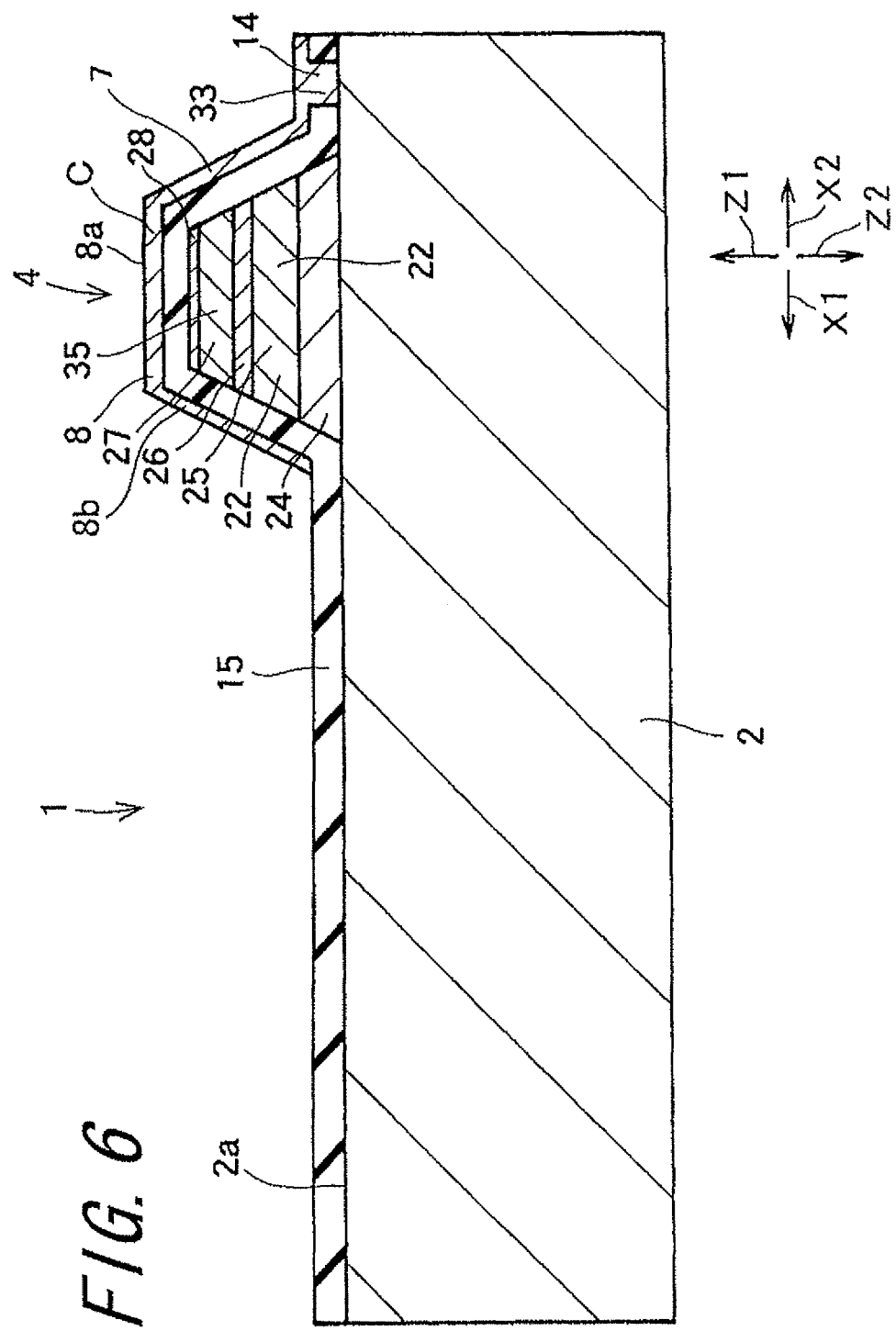
FIG. 6 is a sectional view showing the light-emitting apparatus.

FIG. 5 is a sectional view showing the circuit board (light-emitting apparatus 1) in accordance with a second embodiment of the invention. FIG. 6 is a sectional view showing the light-emitting apparatus 1. Although the light-emitting apparatus of this embodiment has basically the same structure as that of the construction described referring to FIGS. 1A to 1C, for the sake of giving a detailed explanation of the component's own configuration, in these figures, the wire and the second insulating layer depicted in FIGS. 1A to 1C have been omitted. It is noted that FIG. 5 is a sectional view taken along the plane of section of, of the light-emitting apparatus 1 as a whole, a gate base portion 34 and a light-emitting element main body 11 that will hereafter be described. Moreover, FIG. 6 is a sectional view taken along the plane of section of a cathode base portion 22 that will hereafter be described.

In the construction shown in FIGS. 5 and 6, the light-emitting apparatus 1 comprises a substrate 2, a light-emitting element 3, a base portion 4, a gate wiring line 5, an anode wiring line 6, a cathode wiring line 7, and a conductor 8. In the description related to FIGS. 1A to 1C, the detailed structure of connection between the conductor and the electrode of the light-emitting element has been omitted. By contrast, FIGS. 5 and 6 give the illustration of a state where the gate wiring line 5, the anode wiring line 6, the cathode wiring line 7, and so forth act to provide electrical connection between the conductor 8 and the electrode of the light-emitting element 3.

The substrate 2 is constructed of a platy n-type semiconductor. The light-emitting element 3 is formed on one surface 2a of the substrate 2 in the direction of thickness of the substrate 2 (hereafter referred to as "the thicknesswise direction Z") so as to be situated at the side of an end of the substrate 2 in the direction of width of the substrate 2 (hereafter referred to as "the widthwise direction X") in one X1 of the widthwise directions X. In this embodiment, the light-emitting element 3 is constructed of a light-emitting thyristor of pnpn structure. The light-emitting element 3 comprises the light-emitting element main body 11, a first electrode 12, a second electrode 13, and a part of an insulating layer 15 formed so as to be overlaid on the light-emitting element main body 11. The light-emitting element 3 is caused to emit light by applying a potential difference greater than a threshold voltage between an anode and a cathode. The threshold voltage varies according to the level of a voltage to be applied to a gate.

The light-emitting element main body 11 is formed on one surface 2a of the substrate 2 in the thicknesswise direction Z by stacking a first n-type semiconductor layer 16, a first p-type semiconductor layer 17, a second n-type semiconductor layer 18, a second p-type semiconductor layer 19, and an ohmic contact layer 20 one after another in the order named. The light-emitting element main body 11 is formed, with its lateral surface made convergent in one Z1 of the thicknesswise directions Z from the substrate 2.

A substrate of a semiconductor capable of crystal growth such as a Group III-V compound semiconductor or a Group IV semiconductor can be taken up as exemplary of the substrate 2. Examples of usable semiconductor materials include gallium arsenide (GaAs), indium phosphide (InP), gallium phosphide (GaP), silicon (Si), and germanium (Ge).

The first n-type semiconductor layer 16 is made of a semiconductor material such as gallium arsenide (GaAs), aluminum gallium arsenide (AlGaAs), or indium gallium phosphide (InGaP). The first n-type semiconductor layer 16 preferably has a carrier density of approximately $1 \times 10^{18}$ cm$^{-3}$.

The first p-type semiconductor layer 17 is made of a semiconductor material such as aluminum gallium arsenide (AlGaAs) or gallium arsenide (GaAs). The semiconductor material used to form the first p-type semiconductor layer 17 is selected from among those having the same energy gap as that of the semiconductor material for forming the first n-type semiconductor layer 16 or those having an energy gap smaller than the energy gap of the semiconductor material for forming the first n-type semiconductor layer 16. The first p-type semiconductor layer 17 preferably has a carrier density of approximately $1 \times 10^{17}$ cm$^{-3}$.

The second n-type semiconductor layer 18 is made of a semiconductor material such as aluminum gallium arsenide (AlGaAs) or gallium arsenide (GaAs). The semiconductor material used to form the second n-type semiconductor layer 18 is selected from among those having the same energy gap as that of the semiconductor material for forming the first p-type semiconductor layer 17 or those having an energy gap smaller than the energy gap of the semiconductor material for forming the first p-type semiconductor layer 17. The second n-type semiconductor layer 18 preferably has the lowest carrier density among all of the layers composed of the first n-type semiconductor layer 16, the first p-type semiconductor layer 17, the second n-type semiconductor layer 18, and the second p-type semiconductor layer 19. Specifically, it is preferable that the carrier density of the second n-type semiconductor layer 18 falls in a range of approximately $1\times10^{16}$ cm$^{-3}$ to $1\times10^{17}$ cm$^{-3}$. By forming the second n-type semiconductor layer 18 from a semiconductor material such as aluminum gallium arsenide (AlGaAs) or gallium arsenide (GaAs), the resultant light-emitting element becomes capable of providing high internal quantum efficiency.

The second p-type semiconductor layer 19 is made of a semiconductor material such as aluminum gallium arsenide (AlGaAs) or gallium arsenide (GaAs). The semiconductor material used to form the second p-type semiconductor layer 19 is selected from among those having the same energy gap as that of the semiconductor material for forming the first p-type semiconductor layer 17 and that of the semiconductor material for forming the second n-type semiconductor layer 18, or those having an energy gap greater than the energy gap of the semiconductor material for forming the first p-type semiconductor layer 17 and the energy gap of the semiconductor material for forming the second n-type semiconductor layer 18. The second p-type semiconductor layer 19 preferably has a carrier density of approximately $1\times10^{18}$ cm$^{-3}$.

The ohmic contact layer 20 is of a p-type semiconductor layer made of a semiconductor material such as gallium arsenide (GaAs) or indium gallium phosphide (InGaP), which is provided to effect ohmic contact with the first electrode 12. The ohmic contact layer 20 preferably has a carrier density of greater than or equal to $1\times10^{19}$ cm$^{-3}$.

The light-emitting element main body 11 includes a second electrode connector part 21 which is connected to the second electrode 13. The second electrode connector part 21 is formed by extending the first n-type semiconductor layer 16 and a part of the first p-type semiconductor layer 17 situated toward the substrate 2 in the thicknesswise direction Z further in the other X2 of the widthwise directions X from the area in which the first n-type semiconductor layer 16, the first p-type semiconductor layer 17, the second n-type semiconductor layer 18, the second p-type semiconductor layer 19, and the ohmic contact layer 20 are stacked on top of one another.

The base portion 4 is formed on one surface 2a of the substrate 2 in the thicknesswise direction Z so as to be situated in a different area than where the light-emitting element 3 is placed. The base portion 4 is formed at the side of an end of the substrate 2 in the other X2 of the widthwise directions X. In FIG. 5, the base portion 4 includes an anode base portion, a gate base portion 34, a cathode base portion 35, and a third electrode 14 that are arranged at a predetermined spacing in an arrangement direction Y perpendicular to the thicknesswise direction Z and the widthwise direction X. The anode base portion, the gate base portion 34, and the cathode base portion 35 will be referred to simply as the base portion 4 when they are called collectively or when an unspecified one of them is named. The base portion 4 comprises a base portion main body 22 and a part of the insulating layer 15 formed so as to be overlaid on the base portion main body 22.

For example, in FIG. 5, the base portion main body 22 is formed by stacking together semiconductor layers each having the same thickness as that of the corresponding semiconductor layer of the light-emitting element main body 11. The layer configuration of the base portion main body 22 is made up with the same materials as those used in the light-emitting element main body 11. Therefore, each of the semiconductor layers of the base portion main body 22 bears the same designation as that of the corresponding semiconductor layer of the light-emitting element main body 11.

The base portion main body 22 is formed on one surface 2a of the substrate 2 in the thicknesswise direction Z by stacking a first n-type semiconductor layer 24, a first p-type semiconductor layer 25, a second n-type semiconductor layer 26, a second p-type semiconductor layer 27, and an ohmic contact layer 28 one after another in the order named. The base portion main body 22 is formed in the shape of a truncated quadrangular pyramid.

The insulating layer 15 is a constituent component identical with the first insulating layer which has been described earlier referring to FIG. 1. The insulating layer 15 is so formed as to cover the surface of the light-emitting element main body 11, the surface of the base portion main body 22, and the surface of the substrate 2 from one Z1 of the thicknesswise directions Z. The insulating layer 15 is made of a resin material having electrical insulation property, light-transmittable property, and flattening property. The insulating layer 15 is made of polyimide, benzocyclobutene (BCB), or the like.

The light-emitting element 3 and the base portion 4 are arranged as close to each other as possible to achieve miniaturization of the light-emitting apparatus 1. A spacing W1 between the light-emitting element 3 and the base portion 4 falls in a range of 10 μm to 200 μm, for example.

In a part of the insulating layer 15 laminated on one surface 20a of the ohmic contact layer 20 in the thicknesswise direction Z of the light-emitting element main body 11, there is formed a first through hole 31 passing therethrough in the thicknesswise direction Z. Moreover, in a part of the insulating layer 15 laminated on one surface 21a of the second electrode connector part 21 in the thicknesswise direction Z, there is formed a second through hole 32 passing therethrough in the thicknesswise direction Z. Further, as shown in FIG. 6, in a part of the insulating layer 15 lying between the cathode base portion 35 and an end of the substrate 2 in the other X2 of the widthwise directions X, there is formed a third through hole 33 passing therethrough in the thicknesswise direction Z.

The first electrode 12 is so formed as to cover the first through hole 31 from one Z1 of the thicknesswise directions Z. The first electrode 12 corresponds to the anode of the light-emitting element 3. The second electrode 13 is so formed as to cover the second through hole 32 from one Z1 of the thicknesswise directions Z. The second electrode 13 corresponds to the gate of the light-emitting element 3. The third electrode 14 shown in FIG. 6 is so formed as to cover the third through hole 33 from one Z1 of the thicknesswise directions Z. The third electrode 14 is electrically connected to the first n-type semiconductor layer 16 through the substrate 2 and thus corresponds to the cathode of the light-emitting element 3. The first to third electrodes 12, 13, and 14 are made of an electrically conductive material such as a metal material or an alloy material.

The base portion 4 is formed with the conductor 8 to which is connected one end of the wire. The conductor 8 includes a pad part 8a and a lateral wiring part 8b. The pad part 8a is placed on one surface 4a of the base portion 4 in the thicknesswise direction Z, namely on the top surface of the base portion 4. The lateral wiring part 8b is placed on a lateral surface of the base portion 4. The light-emitting apparatus 1 is electrically connected to another apparatus through the wire. The conductor 8 includes an anode conductor formed over the entire one surface of the anode base portion in the thicknesswise direction Z, a gate conductor G formed over the entire one surface 4a of the gate base portion 34 in the thicknesswise direction Z, and a cathode conductor C formed on one surface 4a of the cathode base portion 35 in the thicknesswise direction Z. In the following description, the gate conductor G and the cathode conductor C formed on one surface 4a of the cathode base portion 35 in the thicknesswise direction Z will be referred to simply as the conductor 8 when they are called collectively, when an unspecified one of them is named, and when the pad part 8a and the lateral wiring part 8b are called collectively without making a distinction between them.

The gate wiring line 5 is disposed, along the surface of the insulating layer 15, between the second electrode 13 and the gate conductor G. The gate conductor G is electrically connected to the second electrode 13 through the gate wiring line 5.

The anode wiring line 6 is disposed, along the surface of the insulating layer 15, between the first electrode 12 and the anode conductor. The anode conductor is electrically connected to the first electrode 12 through the anode wiring line 6. The anode wiring line 6 is spaced a predetermined distance away from the gate wiring line 5 to prevent occurrence of short-circuiting.

The cathode wiring line 7 is disposed, along the surface of the insulating layer 15, between the third electrode 14 and the cathode conductor C. The cathode conductor C is electrically connected to the third electrode 14 through the cathode wiring line 7. Where the cathode of the light-emitting element 3 is connected to ground, it is advisable to establish connection between the cathode conductor C and ground by a wire.

The first electrode 12, the second electrode 13, the third electrode 14, the anode wiring line 6, the gate wiring line 5, the cathode wiring line 7, the anode conductor, the gate conductor G, and the cathode conductor C are each made of gold (Au), an alloy of gold and germanium (AuGe), an alloy of gold and zinc (AuZn), or the like material.

The light-emitting element main body 11 and the base portion main body 22 are each constructed by stacking the semiconductor materials for forming the first n-type semiconductor layer 16, 24, the first p-type semiconductor layer 17, 25, the second n-type semiconductor layer 18, 26, the second p-type semiconductor layer 19, 27, and the ohmic contact layer 20, 28, respectively, one after another on one surface 2a of the substrate 2 by means of epitaxial growth, chemical vapor deposition (CVD), or otherwise, followed by performing patterning and etching thereon using a photolithography technique. In this way, the light-emitting element main body 11 and the base portion main body 22 can be formed at one time in a series of production process steps. This makes it possible to form the base portion main body 22 without increasing the number of process steps, and thereby reduce the manufacturing cost.

The insulating layer 15 is formed by applying the above-stated resin material such as polyimide by means of spin coating and then curing the coat of the resin material, followed by performing patterning and etching using the photolithography technique to create the first to third through holes 31, 32, and 33.

Following the formation of the insulating layer 15, the first to third electrodes 12, 13, and 14, the anode wiring line 6, the gate wiring line 5, the cathode wiring line 7, the anode conductor, the gate conductor G, and the cathode conductor C are formed at one time by laminating the conductive material on the surface of the insulating layer 15 by means of vapor deposition or otherwise, followed by performing patterning and etching using the photolithography technique. Accordingly, the first to third electrodes 12, 13, and 14, the anode wiring line 6, the gate wiring line 5, the cathode wiring line 7, the anode conductor, the gate conductor G, and the cathode conductor C have substantially the same thickness.

The anode conductor, the cathode conductor C, and the gate conductor G are formed at the side of the light-emitting apparatus 1 farthest away from one surface 2a of the substrate 2. Moreover, the anode wiring line 6, the gate wiring line 5, and the cathode wiring line 7 are formed closer to the substrate 2 than is an imaginary plane 10. A height H, which is a distance from one surface 2a of the substrate 2 to one surface 3a of the light-emitting element 3 in the thicknesswise direction Z as well as one surface of the conductor 8 in the thicknesswise direction Z, is so selected as to fall in a range of 2 µm to 10 µm, for example.

That is, the anode conductor, the cathode conductor C, and the gate conductor G are spaced away from the anode wiring line 6, the gate wiring line 5, and the cathode wiring line 7. Since a sufficient space can be secured between these conductors and the light-emitting element 3, it is possible to reduce the possibility of collision between the capillary and the light-emitting element 3, as well as to alleviate an impact applied to the light-emitting element 3 at the time of wire connection.

In the present embodiment, in the light-emitting element main body 11, the n-type semiconductor layer and the p-type semiconductor layer may be arranged in the place of each other.

Moreover, in the present embodiment, the distance from the substrate 2 to one surface of the conductor 8 in the thicknesswise direction Z is equal to the thickness of the light-emitting element 3. Alternatively, the base portion 4 or the conductor 8 may be so formed that the distance from the substrate 2 to one surface of the conductor 8 in the thicknesswise direction Z is greater than the thickness of the light-emitting element 3.

In order to alleviate an impact applied to the light-emitting element 3 at the time of wire connection, it is advisable that the light-emitting element 3 and the base portion 4 are spaced away from each other. However, if the spacing W1 between the light-emitting element 3 and the base portion 4 is unduly large, degradation in electric signal or increase in apparatus size will be encountered. Therefore the spacing W1 between the light-emitting element 3 and the base portion 4 is so selected as to fall in a range of 10 µm to 200 µm, for example.

Circuit Board of Third Embodiment

Figure 8:
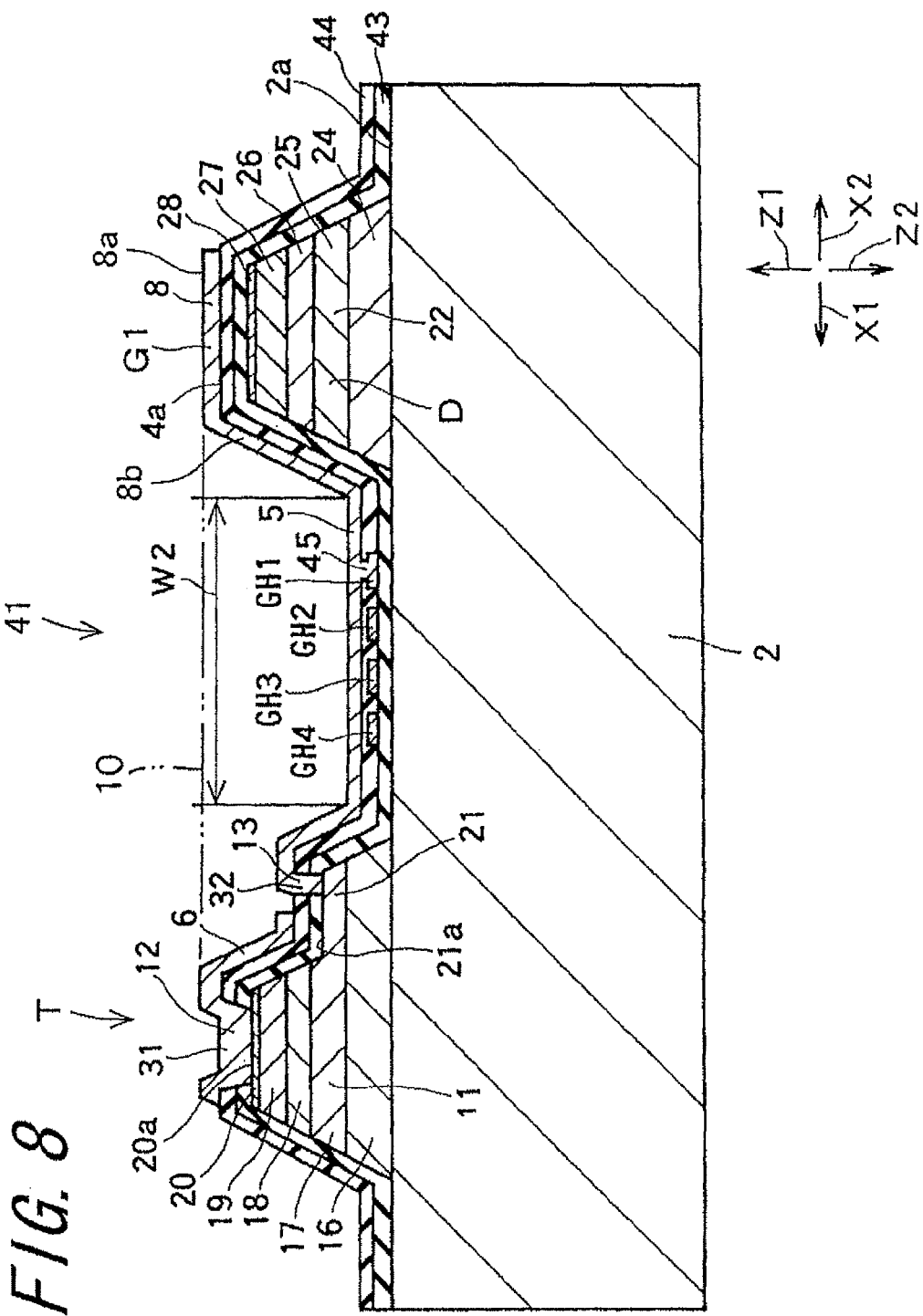
FIG. 8 is a sectional view of the circuit board (light-emitting apparatus) taken along the line IV-IV of FIG. 7.
Figure 9:
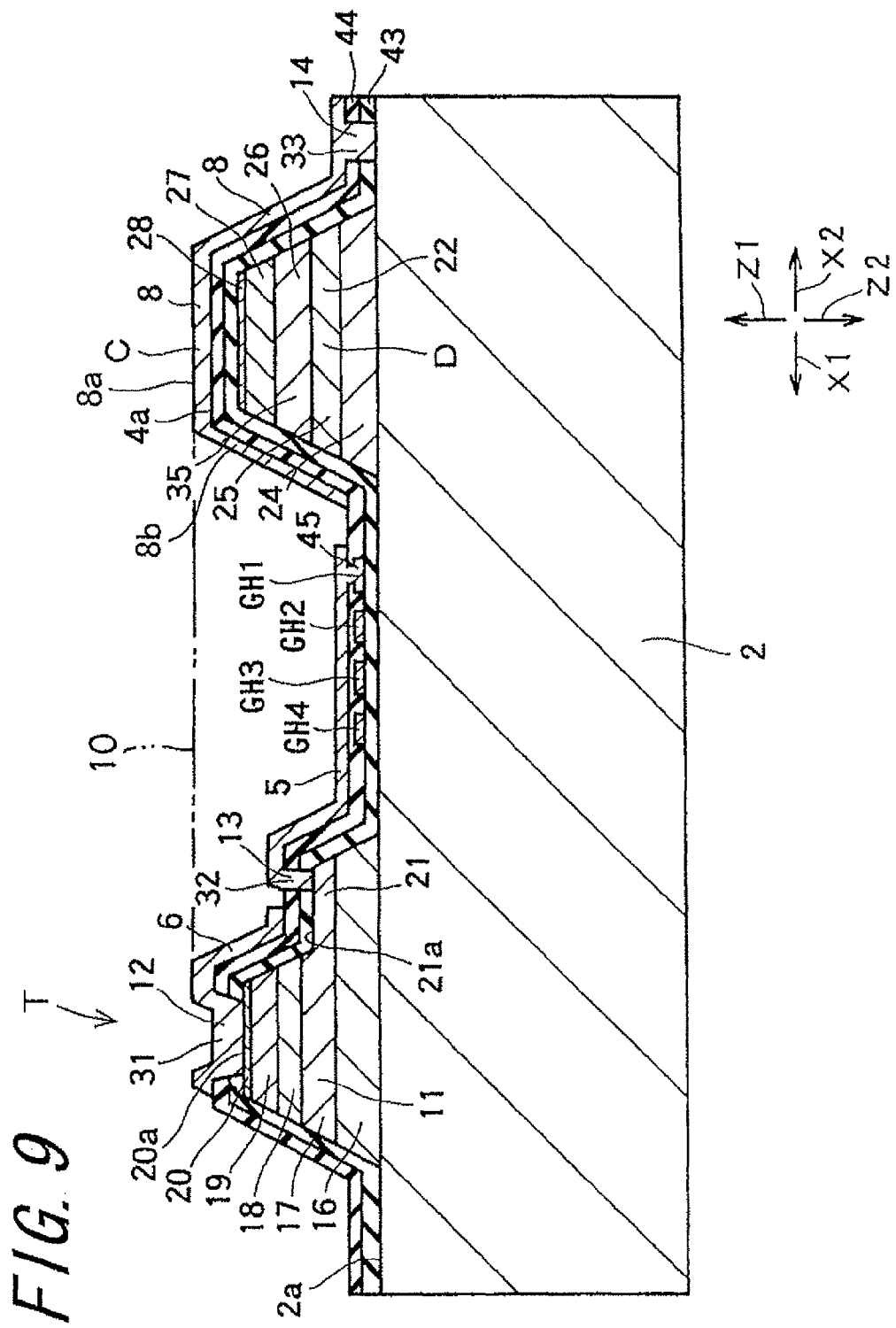
FIG. 9 is a sectional view of the circuit board (light-emitting apparatus) taken along the line V-V of FIG. 7.

A light-emitting apparatus 41 includes a light-emitting element array 42, a plurality of base portions D, a plurality of control signal transmission wiring lines GH, an anode wiring line 6, a gate wiring line 5, a cathode wiring line 7, a first insulating layer 43, a third insulating layer 44, and a plurality of conductors 8. In the light-emitting apparatus 41 shown in FIGS. 7 to 9, components corresponding to those of the light-emitting apparatus 1 of the first embodiment will be identified with the same reference signs. It is noted that the third insulating layer 44 is a different constituent component than the second insulating layer shown in FIG. 1.

Figure 7:
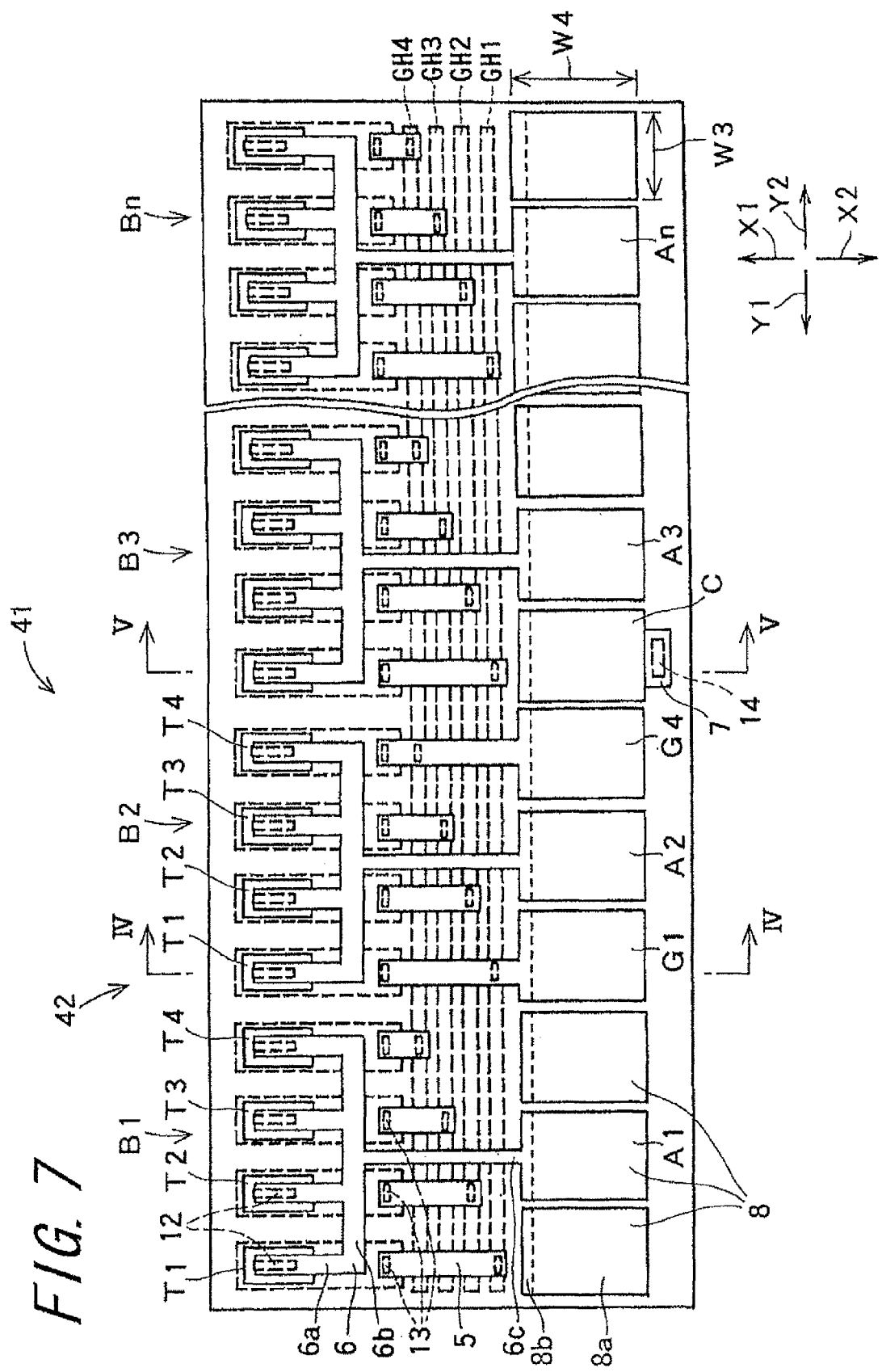
FIG. 7 is a plan view showing the circuit board (light-emitting apparatus) in accordance with a third embodiment of the invention.

The light-emitting element array 42 includes n pieces of light-emitting element blocks B (symbol n refers to an integer greater than or equal to 2). Each light-emitting element block B comprises m pieces of light-emitting elements T (symbol m refers to an integer greater than or equal to 2). That is, the light-emitting element array 42 comprises the light-emitting elements T that are n×m in number. In the light-emitting apparatus as shown in FIG. 7, m=4. The light-emitting elements T are arranged on one surface 2a of the substrate 2 in the thicknesswise direction Z so as to be situated at the side of an end of the substrate 2 in one X1 of the widthwise directions X. The light-emitting elements T are spaced apart in a linear fashion along an arrangement direction Y. The light-emitting element blocks B are each formed of an array of m pieces of the light-emitting elements T that are placed one after another, starting from one Y1 of the arrangement directions Y. Among n pieces of the light-emitting element blocks B, the i-th light-emitting element block B (symbol i refers to 1 or more and n or less) enumerated from one Y1 of the arrangement directions Y will be termed "the light-emitting element block Bi". Moreover, among the light-emitting elements T constituting the light-emitting element block Bi, the j-th light-emitting element T (symbol j refers to 1 or more and m or less) enumerated from one Y1 of the arrangement directions Y will be termed "the light-emitting element Tj". The light-emitting element Tj will be referred to simply as the light-emitting element T when a plurality of light-emitting elements T are called collectively or when an unspecified one of them is named. Likewise, the light-emitting element block Bi will be referred to simply as the light-emitting element B when a plurality of light-emitting blocks B are called collectively or when an unspecified one of them is named. The light-emitting element T is designed to emit light with a wavelength falling in a range of 600 nm to 800 nm.

The light-emitting element T is similar in structure to the light-emitting element 3 of the light-emitting apparatus 1 of the foregoing first embodiment. Therefore, the corresponding components will be identified with the same reference signs. The light-emitting element T comprises a light-emitting element main body 11, a part of the first insulating layer 43, a part of the third insulating layer 44, a first electrode 12, and a second electrode 13. Especially, the light-emitting element main body 11 has the same configuration as that of the light-emitting element main body 11 of the light-emitting apparatus 1 of the foregoing first embodiment.

In the light-emitting elements T constituting each of the light-emitting element blocks B, their first electrodes 12 are electrically connected to each other via the anode wiring line 6 for each of the light-emitting element blocks B.

In the present embodiment, the light-emitting apparatus 41 includes 3×n pieces of base portions D. The base portions D are arranged on one surface 2a of the substrate 2 in the thicknesswise direction Z so as to be situated at the side of an end of the substrate 2 in the other X2 of the widthwise directions X. The base portions D are spaced apart in a linear fashion along the arrangement direction Y. The base portion D is similar in structure to the base portion 4 of the light-emitting apparatus 1 of the foregoing first embodiment. Therefore, the corresponding components will be identified with the same reference signs. The base portion D comprises a base portion main body 22, a part of the first insulating layer 43, a part of the third insulating layer 44, and a third electrode 14. Especially, the base portion main body 22 has the same configuration as that of the base portion main body 22 of the light-emitting apparatus 1 of the foregoing first embodiment.

In order to achieve miniaturization of the light-emitting apparatus 41, the light-emitting element T and the base portion D are closely arranged at a spacing that allows formation of the control signal transmission wiring line GH which will hereafter be described. A spacing W2 between the light-emitting element T and the base portion D is so selected as to fall in a range of 10 μm to 200 μm, for example.

The conductor 8 is similar in configuration to the conductor 105 shown in FIG. 1A. A dimension W3 of a pad part 8a in the widthwise direction X is so selected as to fall in a range of 30 μm to 120 μm, for example. Moreover, a dimension W4 of the pad part 8a in the arrangement direction Y is so selected as to fall in a range of 30 μm to 120 μm, for example.

According to the structure of the light-emitting apparatus 41, the plurality of light-emitting elements T are arranged in an array and likewise the plurality of base portions D are arranged in an array. Since the pad parts 8a on the base portions D can be arranged in proximity to the light-emitting elements T, it is possible to reduce the size of the light-emitting apparatus 41 in the widthwise direction X.

Among the plurality of conductors 8, the 3×i−1-th conductor 8 enumerated from one Y1 of the arrangement directions Y will be termed "the anode conductor Ai". Hereinafter the anode conductor Ai will be referred to simply as the anode conductor A when a plurality of anode conductors A are called collectively or when an unspecified one of them is named.

As shown in FIG. 7, the light-emitting apparatus 41 includes as many control signal transmission wiring lines GH as the light-emitting elements T constituting the light-emitting element block B (m pieces); that is, includes m pieces of the control signal transmission wiring lines GH. In the light-emitting apparatus 41 shown in FIG. 7, since m=4, it follows that the light-emitting apparatus 41 includes four control signal transmission wiring lines, namely first to fourth control signal transmission wiring lines GH1, GH2, GH3 and GH4.

The control signal transmission wiring lines GH are formed between the light-emitting element array 42 and the base portions D. The control signal transmission wiring lines GH are formed on one surface of the first insulating layer 43, which corresponds to the insulating layer 15 of the light-emitting apparatus 1 of the foregoing first embodiment, in the thicknesswise direction Z so as to be arranged along the arrangement direction Y. The first to fourth control signal transmission wiring lines GH1, GH2, GH3 and GH4 are connected one by one to the second electrode 13 of each of the light-emitting elements T via the gate wiring line 5. The first to fourth control signal transmission wiring lines GH1, GH2, GH3 and GH4 are each disposed along an array of the light-emitting elements T so as to make connection with the corresponding one of the four second electrodes 13 of, respectively, the light-emitting elements T. That is, the first control signal transmission wiring line GH1 is electrically connected to the second electrode 13 of the light-emitting element T1, the second control signal transmission wiring line GH2 is electrically connected to the second electrode 13 of the light-emitting element T2, the third control signal transmission wiring line GH3 is electrically connected to the second electrode 13 of the light-emitting element T3, and the fourth control signal transmission wiring line GH4 is electrically connected to the second electrode 13 of the light-emitting element T4.

The first to fourth control signal transmission wiring lines GH1, GH2, GH3, and GH4 are each electrically connected to one of the plurality of conductors 8 via the gate wiring line 5. Hereinafter the conductors 8 electrically connected to the first to fourth control signal transmission wiring lines GH1, GH2, GH3, and GH4, respectively, will be termed "the first gate conductor G1", "the second gate conductor G2", "the third gate conductor G3", and "the fourth gate conductor G4", respectively.

Moreover, one of the plurality of base portions D corresponds to the cathode base portion 35 of the light-emitting apparatus 1 of the foregoing first embodiment. Hereinafter the conductor 8 electrically connected to the third electrode 14 via the cathode wiring line 7 will be termed "the cathode conductor C".

The first insulating layer 43 corresponds to the insulating layer 15 of the light-emitting apparatus 1 of the foregoing first embodiment.

The third insulating layer 44 covers the surfaces of the first insulating layer 43 and the control signal transmission wiring line GH from one Z1 of the thicknesswise directions Z. The above-stated gate wiring line 5 extends in the widthwise direction X along the surface of the third insulating layer 44, and is connected to a predetermined control signal transmission wiring line GH. The third insulating layer 44 has a through hole 45 formed in a part thereof which lies on the connection area of the gate wiring line 5 and the control signal transmission wiring line GH. A part of the gate wiring line 5 is formed in the through hole 45.

The anode wiring line 6 is formed along the surface of the third insulating layer 44. Moreover, the anode wiring line 6 comprises a first extending part 6a extending from the first electrode 12 to a side of the second electrode connector part 21 in one Z1 of the thicknesswise directions Z, a second extending part 6b extending in the arrangement direction Y so as to establish connection among the ends of the extending parts 6a opposite from the ends thereof at the side of the first electrode 12, and a third extending part 6c extending in the widthwise direction X from a midportion of the second extending part 6b in the arrangement direction Y so as to be connected to the anode conductor A.

In a part of the first insulating layer 43 and the third insulating layer 44, there is formed a first through hole 31 passing therethrough in the thicknesswise direction Z. In another part of the first insulating layer 43 and the third insulating layer 44, there is formed a second through hole 32 passing therethrough in the thicknesswise direction Z. In still another part of the first insulating layer 43 and the third insulating layer 44, there is formed a third through hole 33 passing therethrough in the thicknesswise direction Z.

The first electrode 12 corresponds to an anode. The second electrode 13 corresponds to a gate. The third electrode 14 corresponds to a cathode.

The light-emitting element main body 11 and the base portion main body 22 are formed through process steps similar to those adopted in the foregoing first embodiment.

The following is the method of forming the first insulating layer 43 and the third insulating layer 44. To begin with, the above-stated resin material such as polyimide is applied by means of spin coating, and then the coat of the resin material is cured. After that, patterning and etching are performed thereon by the photolithography technique to create the first to third through holes 31, 32, and 33. In this way, the first insulating layer 43 and the third insulating layer 44 can be formed.

Figure 10:
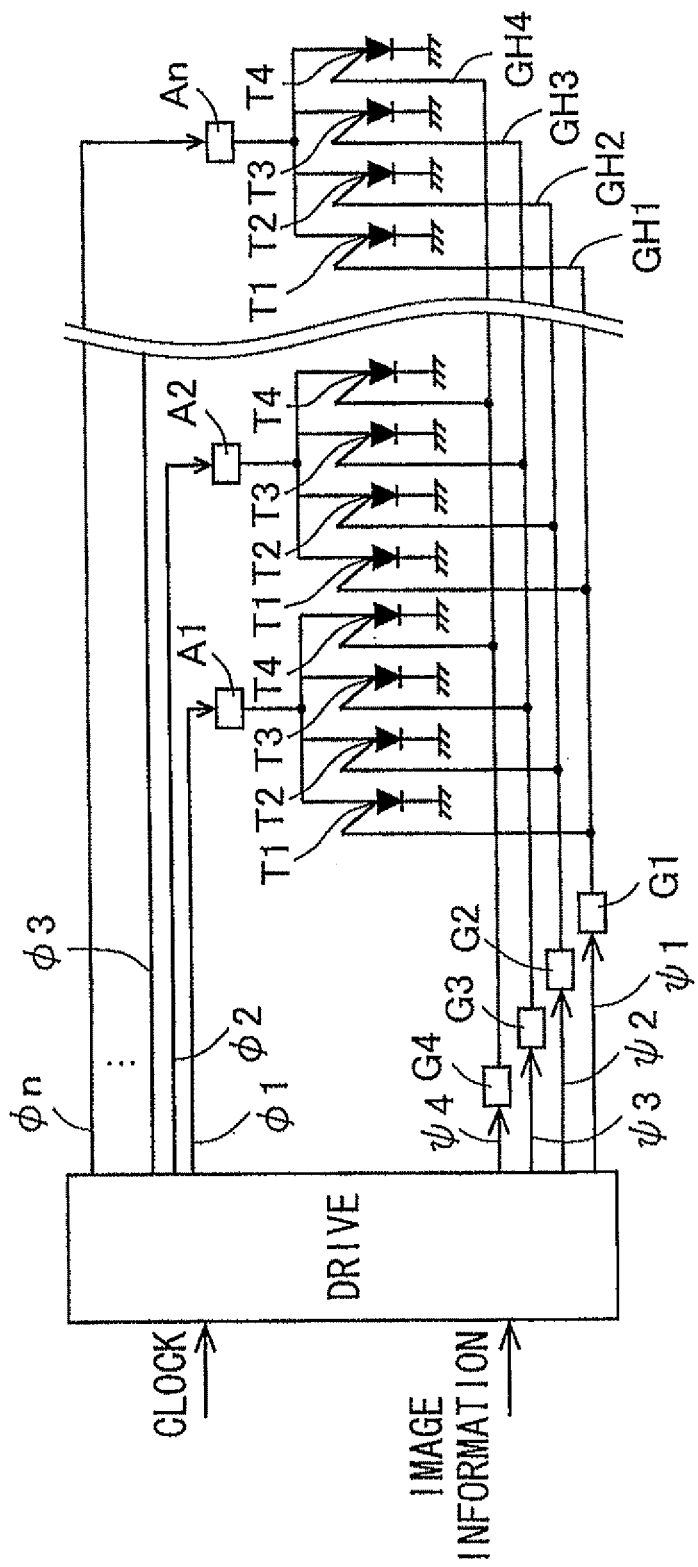
FIG. 10 is a circuit diagram showing an equivalent circuit of the circuit board (light-emitting apparatus) shown in FIG. 7.

FIG. 10 is a circuit diagram showing an equivalent circuit of the light-emitting apparatus 41 shown in FIG. 7. The light-emitting apparatus 41 includes also a driving section. The driving section is electrically connected to each of the anode conductors A and each of the gate conductors G via a wire. In the light-emitting apparatus 41 shown in FIG. 10, the cathode conductor C corresponding to the cathode of each light-emitting element T is set at ground potential.

The driving section provides a select signal $\phi i$ to the anode conductor Ai, and provides a control signal $\psi j$ to the gate conductor Gj. The select signal $\phi i$ is fed, through the anode wiring line 6, to each of the anodes of the light-emitting elements T1, T2, T3 and T4 included in the light-emitting element block Bj. The control signal $\psi j$ is fed, through the control signal transmission wiring line GHj, to the gate of each light-emitting element Tj. The driving section is practically realized by using a driver IC (Integrated Circuit) for driving operation.

In the light-emitting element T, when the cathode is grounded, a high-level voltage is applied to the anode. The light-emitting element T emits light when a low-level voltage is applied to the gate, yet stays out when a high-level voltage is applied to both the anode and the gate or when a low-level voltage is applied to both the anode and the gate. For example, the high-level voltage stands at 3 to 10 volts, whereas the low-level voltage stands at 0 (zero) volt. Therefore, for example, when the light-emitting element T2 of the light-emitting element block Bi is caused to emit light, the driving section provides a high-level select signal $\phi i$, and also provides a low-level control signal $\psi 2$ and high-level control signals $\psi 1$, $\psi 3$ and $\psi 4$. By controlling the issuance of the select signal $\phi i$ and the control signal $\psi j$ in that way, the light-emitting elements T can be caused to emit light in a selective manner. For example, in the case of forming the pad part 8a for bonding individually for each of the gate and the anode of the light-emitting element T, there is a need to prepare twice as many pad parts 8a as the light-emitting elements T. However, by grouping m pieces of the light-emitting elements T in the light-emitting element block B, the number of terminals to be connected to the driving section can be set at n+m. This helps minimize the number of the terminals of the driving section.

The driving section receives input of a clock pulse signal used as the reference from without. On the basis of this clock pulse signal, the driving section outputs control signals $\psi 1$ to $\psi 4$ in synchronization. The clock pulse signal is provided from a control section 96 of an image forming apparatus 87 which will hereafter be described. The clock cycle of the clock pulse signal is so selected as to be longer than the control cycle set for the control section 96 of the subsequently-described image forming apparatus 87. Moreover, the driving section outputs a select signal $\phi i$ on the basis of image information provided thereto together with the clock pulse signal.

Circuit Board of Fourth Embodiment

Figure 11:
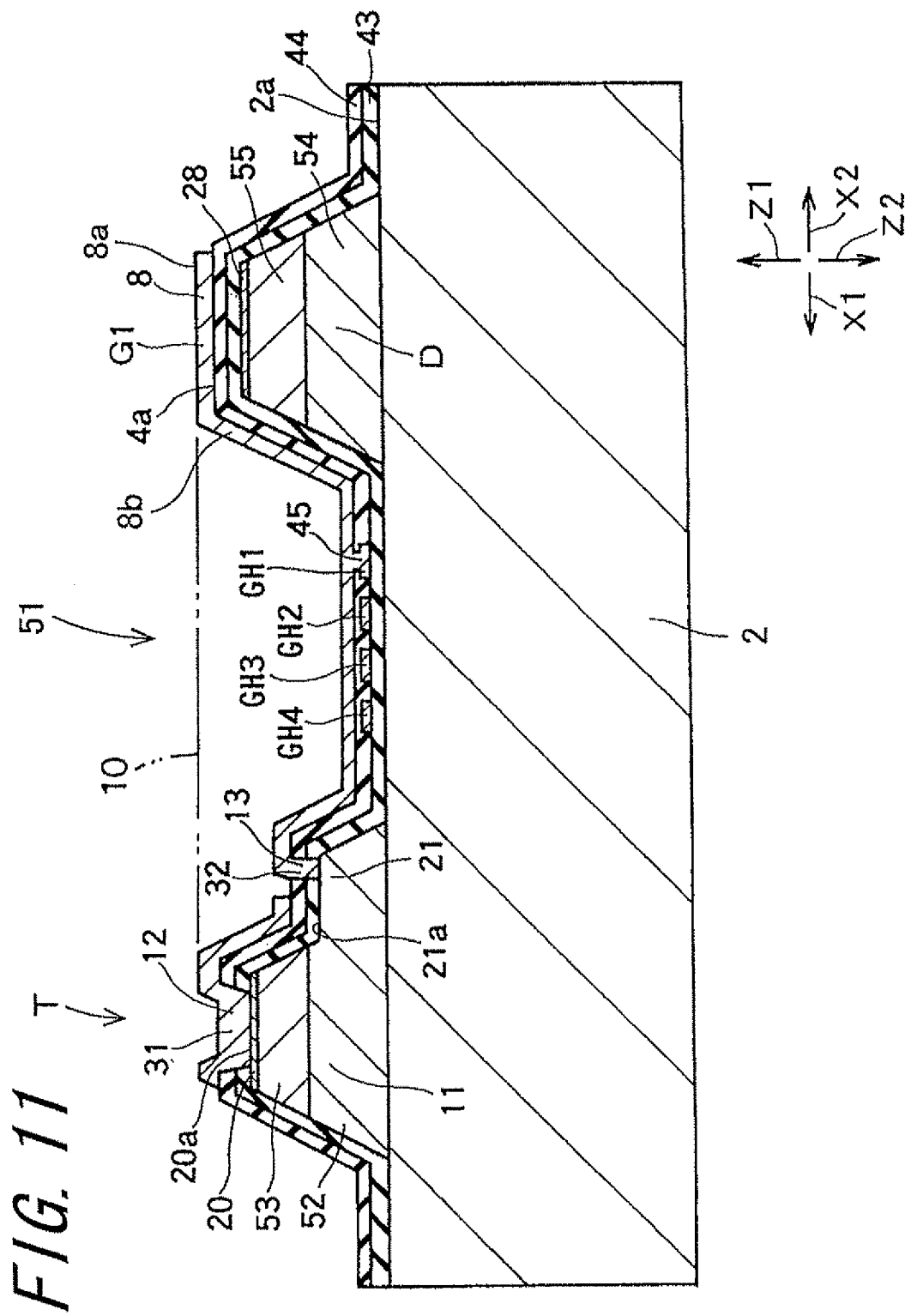
FIG. 11 is a sectional view showing a circuit board (light-emitting apparatus) in accordance with a fourth embodiment of the invention.

FIG. 11 is a sectional view showing a light-emitting apparatus 51 which is a circuit board in accordance with a fourth embodiment of the invention. The light-emitting apparatus 51 is constructed by removing the cathode wiring line 7 and the third electrode 14 from the light-emitting apparatus 41 of the second embodiment and using a light-emitting diode for the light-emitting element T instead of the light-emitting thyristor. Even if the light-emitting element T is constructed of a light-emitting diode, the driving section is able to cause the light-emitting elements T to emit light in a selective manner by providing control signals $\psi$ and select signals $\phi$.

According to the light-emitting apparatus 41 of the fourth embodiment of the invention thus far described, just like the light-emitting apparatus 1 of the foregoing first embodiment, a wire can be made resistant to separation. This makes it possible to enhance the reliability and thereby prolong the service life of the apparatus.

Moreover, in the light-emitting apparatus 41, since the groove 108 can be displaced toward the light-emitting element T, it is possible to arrange the relevant pad parts 8a closely, and thereby arrange the light-emitting elements T densely in the arrangement direction Y. This allows a high-resolution image forming apparatus 87 to be attained.

As to Image Forming Apparatus

Figure 12:
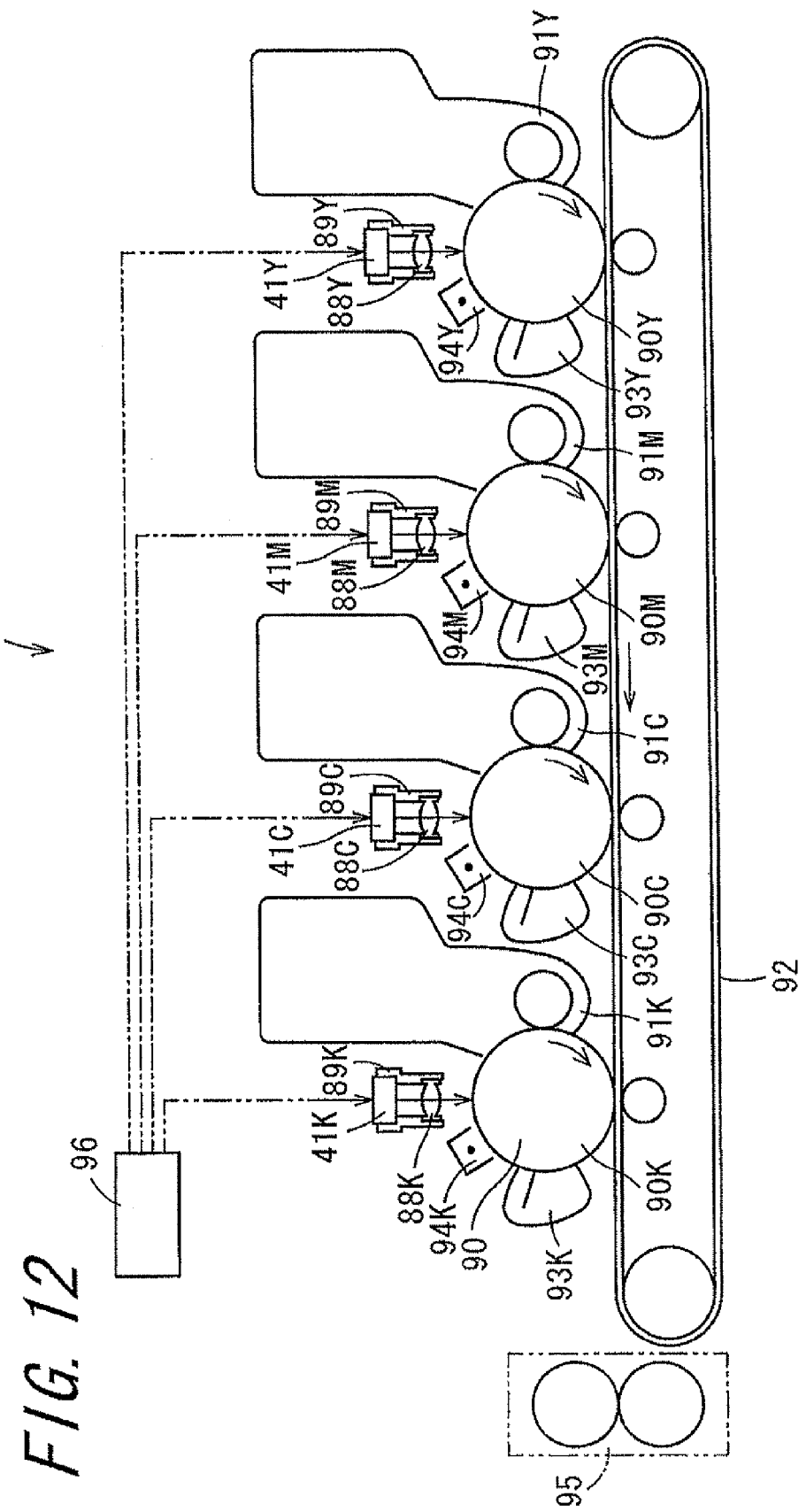
FIG. 12 is a side view showing the image forming apparatus in accordance with an embodiment of the invention.

Next, an image forming apparatus in accordance with another embodiment of the invention will be explained. FIG. 12 is a side view showing the basic configuration of the image forming apparatus 87 having the light-emitting apparatus 41. It is noted that the image forming apparatus 87 implemented by way of the circuit board of one embodiment of the invention is built as an electrophotographic image forming apparatus and includes the light-emitting apparatus 41 for use as a device for performing light exposure on a photoreceptor drum 90. As shown in FIG. 2, the light-emitting apparatus 41 is mounted on a printed circuit board equipped with a driving circuit which is a driving IC, for example.

The image forming apparatus 87 is an apparatus employing a tandem system for forming images of four colors: Y (yellow); M (magenta); C (cyan); and K (black). The image forming apparatus 87 shown in FIG. 12 comprises: four light-emitting apparatuses 41Y, 41M, 41C and 41K; first holders 89Y, 89M, 89C and 89K for holding circuit boards bearing lens arrays 88Y, 88M, 88C and 88K, respectively, acting as a light condensing section, and the lens arrays 88; four photoreceptor drums 90Y, 90M, 90C and 90K; four developer supply sections 91Y, 91M, 91C and 91K; a transfer belt 92 acting as a transfer section; four cleaners 93Y, 93M, 93C and 93K; four charging devices 94Y, 94M, 94C and 94K; a fixing section 95; and a control section 96.

Each of the light-emitting apparatuses 41 is driven on the basis of image information of its color by the driving section.

Light emitted from each light-emitting apparatus is converged through the lens array 88 and irradiated on each of the photoreceptor drums 90Y, 90M, 90C and 90K. The lens array 88 includes a plurality of lenses arranged on the optical axis of the light-emitting apparatus, for example. These lenses are combined in a one-piece design to thereby constitute the lens array 88.

The light-emitting apparatus 41 and the lens array 88 are retained by the first holder 89. The first holder 89 is so positioned that the direction in which the light-emitting apparatus 41 emits light and the direction of the optical axis of the lens in the lens array 88 substantially coincide with each other.

For example, the photoreceptor drums 90Y, 90M, 90C and 90K are each constructed by applying a photosensitive layer to a surface of a cylindrical base body. On the photosensitive layer is formed an electrostatic latent image under irradiation of light from each of the light-emitting apparatuses 41Y, 41M, 41C and 41K.

Around the photoreceptor drum 90Y, 90M, 90C, 90K, the developer supply section 91Y, 91M, 91C, 91K for feeding a developer to the photoreceptor drum 90Y, 90M, 90C, 90K in an exposed state, the transfer belt 92, the cleaner 93Y, 93M, 93C, 93K, and the charging device 94Y, 94M, 94C, 94K are arranged in the order named in a downstream direction along a rotation direction from a reference position where an electrostatic latent image is formed. The transfer belt 92, by which an image formed on the photoreceptor drum 90 with use of a developer is transferred onto a recording sheet, is made common to all the four photoreceptor drums 90Y, 90M, 90C and 90K.

The photoreceptor drums 90Y, 90M, 90C and 90K are each retained by a second holder. The second holder and the first holder 89 are fixed relatively to each other. The photoreceptor drums 90Y, 90M, 90C, and 90K are each so positioned that the direction of its rotation shaft substantially coincides with the arrangement direction Y which is perpendicular to the thicknesswise direction Z and the widthwise direction X of the light-emitting apparatus.

A recording sheet is conveyed by the transfer belt 92, and the recording sheet bearing an image formed by using a developer is conveyed to the fixing section 95. In the fixing section 95, the developer transferred onto the recording sheet is fixed in place. The photoreceptor drums 90Y, 90M, 90C and 90K are rotated by a rotary driving section.

The control section 96 provides the above-stated driving section with a clock signal and image information, and also controls the rotary driving section for rotatably driving the photoreceptor drums 90Y, 90M, 90C and 90K, the developer supply sections 91Y, 91M, 91C and 91K, the transfer section 92, the charging devices 94Y, 94M, 94C and 94K, and the fixing section 95.

As to Thermal Head

Moreover, as shown in FIG. 13, with the provision of a heat-generating resistor 121 as the driving section, the circuit board of the present embodiment can be used as a thermal head which is used in a thermal printer, an ink-jet printer, or the like. The thermal head in accordance with one embodiment of the invention comprises the circuit board for the thermal head and a second driving circuit 122. The driving circuit 122 is connected to the wire 107, for driving the heat-generating resistor 121 on the basis of second image information.

As to Image Sensor

Further, as shown in FIG. 14, with the provision of a light-receiving element 131 as the driving section, the circuit board of the present embodiment can be used as an image sensor. The image sensor in accordance with one embodiment of the invention comprises the circuit board for the image sensor and an arithmetic circuit 132. The arithmetic circuit 132 performs computation on an electric signal generated in the light-receiving element 131. The electric signal is generated in the light-receiving element 131 in response to an optical pattern (third image information).

The image forming apparatus of the present embodiment equipped with the above-stated light-emitting element or heat-generating resistor, as well as the image sensor of the present embodiment equipped with the light-receiving element, comprises the circuit board of the embodiment capable of offering satisfactory wire adherability even with apparatus miniaturization. This allows an image forming apparatus and an image sensor that are small in size and long in operable life to be attained in high yields.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

REFERENCE SIGNS LIST 1, 41, 51 Light-emitting apparatus
2 Substrate
3 Light-emitting element
4 Base portion
5 Gate wiring line
6 Anode wiring line
7 Cathode wiring line
8 Conductor
8a Pad part
8b Lateral wiring part
12 First electrode
13 Second electrode
14 Third electrode
34 Gate base portion
35 Cathode base portion
42 Light-emitting element array
87 Image forming apparatus
88 Lens array 89 Holder
90 Photoreceptor drum
91 Developer supply section
92 Transfer belt
93 Cleaner
94 Charging device
95 Fixing section
96 Control section
101 Substrate
102 Base portion
103 Light-emitting element
104 First insulating layer
105 Conductor
105a Pad part
105b Lateral wiring part
106 Second insulating layer
107 Wire
107a Connection area
108 Groove
109 Electrode
110 Printed circuit board
111 Driving IC
112 Electrode
113 Capillary
120 Thermal head
121 Heat-generating resistor
122 Driving circuit
130 Image sensor
131 Light-receiving element
132 Arithmetic circuit
A Anode conductor
C Cathode conductor
D Base portion
G Gate conductor
GH Control signal transmission wiring line

The invention claimed is:

1. A circuit board comprising;
   a substrate;
   a conductor which is situated on the substrate and has a groove formed on its surface;
   a wire connected to the conductor; and
   a base portion which is situated on the substrate and has a top surface and a lateral surface,
   the groove being configured to surround a connection area between the wire and the conductor, excluding a part of the connection area defining an opening,
   the conductor including a pad part situated on the top surface and a lateral wiring part which is electrically connected to the pad part and lies on the lateral surface, and
   the opening being situated in a boundary area of the pad part and the lateral wiring part.

2. The circuit board according to claim 1, further comprising:
   a driving section which is situated in a different region from a region where the base portion is formed on the substrate and is electrically connected to the conductor.

3. The circuit board according to claim 2, wherein the base portion has a shape of a truncated pyramid, and
   of a boundary between the top surface and the lateral surface of the truncated pyramid, the boundary area is placed in closest proximity to the driving section in a plan view.

* * * * *